(12) United States Patent
Lee et al.

(10) Patent No.: US 7,323,903 B1
(45) Date of Patent: Jan. 29, 2008

(54) SOFT CORE CONTROL OF DEDICATED MEMORY INTERFACE HARDWARE IN A PROGRAMMABLE LOGIC DEVICE

(75) Inventors: Andy L. Lee, San Jose, CA (US); Brian D. Johnson, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/530,708

(22) Filed: Sep. 11, 2006

Related U.S. Application Data

(63) Continuation of application No. 10/873,668, filed on Jun. 21, 2004, now Pat. No. 7,123,051.

(51) Int. Cl.
*H03K 19/177* (2006.01)
(52) U.S. Cl. .................. 326/40; 326/37; 365/232
(58) Field of Classification Search ............ 326/40
See application file for complete search history.

(56) References Cited

U.S. PATENT DOCUMENTS 6,806,733 B1* 10/2004 Pan et al. ............... 326/41
6,940,768 B2* 9/2005 Dahlberg et al. ........ 365/201

* cited by examiner

*Primary Examiner*—James H. Cho
(74) *Attorney, Agent, or Firm*—Townsend and Townsend and Crew LLP

(57) ABSTRACT

The present invention is directed to a soft core logic circuit implemented in a PLD that estimates an appropriate phase delay and applies the phase shift to a read strobe signal to align its rising and falling edges at the center of a data sampling window associated with a group of read data signals. The soft core logic circuit dynamically determines an appropriate phase-shift value for the read strobe signal and adjusts the phase-shift to accommodate the environmental changes. The soft core logic circuit also introduces into the PLD various intermediate signals from a phase-shift estimator and a programmable phase delay chain.

20 Claims, 5 Drawing Sheets

SOFT CORE CONTROL OF DEDICATED MEMORY INTERFACE HARDWARE IN A PROGRAMMABLE LOGIC DEVICE

CROSS-REFERENCES TO RELATED APPLICATIONS

This application is a continuation of application Ser. No. 10/873,668, filed Jun. 21, 2004, and is related to application Ser. No. 10/873,669, filed Jun. 21, 2004, the disclosures of which are each incorporated herein by reference.

BACKGROUND

The present invention relates generally to memory interface circuitry and more particularly to a soft core logic circuit implemented in a programmable logic device that controls the operation of a programmable phase delay circuit.

The accuracy and reliability of data transmission between different electronic devices are important concerns in integrated circuit (IC) design. FIG. 1A illustrates a typical data transmission system 100 that involves two commonly used electronic devices, a high-performance memory device 110 and a programmable logic device (PLD) 120. To better interface with the memory device 110, the PLD 120 implements within itself a memory interface controller 130, specifically responsible for receiving/sending data from/to the memory device 110. To synchronize the operation of the memory device 110 and the controller 130, an off-chip oscillator 140 generates a reference clock signal, RefCLK, and passes it to the memory interface controller 130 and the memory device 110.

Typically, the memory device 110 and the PLD 120 are connected by multiple data groups 150. Each data group 150 includes a number of channels carrying a plurality of data signals (DQ) and one channel carrying a data strobe signal (DQS). DQS is a special signal that samples the corresponding data signals in the same data group at an electronic device's input/output (IO) interface, e.g., the memory interface controller 130. A data sampling scheme in which DQ is sampled once per DQS cycle, e.g., at its rising edge, is referred to as single-data-rate (SDR) sampling, while a data sampling scheme in which DQ is sampled multiple times per DQS cycle is called multiple-data-rate (MDR) sampling. The most common MDR sampling is the double-data-rate (DDR) sampling in which DQ is sampled twice per DQS cycle, once on the rising edge and once on the falling edge of DQS, both of which are referred to as DQS's data sampling edges.

The most significant advantage of a DDR-based device is that it doubles its IO throughput when compared with an SDR-based device operating at the same frequency. For convenience, data arriving at the PLD 120 from the memory device 110 is called "read data" and data leaving for the memory device 110 from the PLD 120 is called "write data". Accordingly, the data strobe signal associated with the read data (or write data) is referred to as the read strobe signal (or write strobe signal).

Most memory chip standards provide that a read strobe signal be edge-aligned with a set of read data signals. In other words, there is no phase shift between the two types of signals when they leave a memory device and arrive at another device's IO interface. However, such an arrangement is not preferred for data sampling accuracy. To capture the read data signals accurately, it is preferred that the edge of the read strobe signal arrive after the edge of the read data signals. Conventionally, a dedicated phase delay circuit, standalone from or incorporated into the memory interface controller 130, is employed to produce a desired phase shift, e.g., 90°, on the read strobe signal so that the read strobe signal is center-aligned with the read data signals.

FIG. 1B schematically illustrates a typical DDR sampling scheme that can be applied to a memory interface circuit. Initially, a strobe signal (DQS) is edge-aligned with a data signal (DQ) when they reach the interface circuit. The strobe signal is then delayed by a particular phase-shift value $\Phi_{shift}$, so as to shift each of its data sampling edges to approximately the center of a data sampling window $W_{sampling}$ associated with each data bit of the data signal and thereby prevent data sampling errors.

In reality, the read data signals and the read strobe signal are not exactly edge-aligned when they arrive at a device's IO interface due to various off-chip and on-chip skewing factors, such as routing mismatches between the read data signal and the read strobe signal, rise/fall delay mismatches between the read data signal and the read strobe signal, and power noise, etc. Therefore, a fixed phase delay, e.g., 90°, generated by the dedicated phase delay circuit may not center-align the read strobe signal with the read data signals. Meanwhile, the dedicated phase delay circuit itself usually does not have any control mechanism for its user to adjust the circuit's output. On the other hand, because of the advance of semiconductor technology, the operating frequency of a memory device keeps increasing with the result that the time period allocated to a single data bit keeps shrinking. Consequently, the dedicated 90° phase delay circuit and various data skewing factors may cause the read strobe signal to completely miss a desired data sampling window and produce errors in the sampled read data.

In general, there are two major steps in the reduction of sampling errors in the read data. The first step is to eliminate the source of each skewing factor as much as possible. For example, a careful board and package design can help to significantly reduce the routing mismatches between the read data signal and the read strobe signal. However, due to various technical reasons, it is impossible to completely remove the impact of the skewing factors. Consequently, the second step is to take into account in the determination of the phase shift in a device's IO interface design the skewing factors that cannot be eliminated.

When a chip manufacturer releases a new model of memory devices, it typically provides a device specification characterizing the primary features of the new model. The device specification also lists the maximum data skews caused by different skewing factors this new model can tolerate, which represents the worst scenario that can ever happen to this model of memory devices, even though the data skews associated with a particular memory device in a specific application are often significantly smaller than what is described in the device specification.

Not knowing the data skews in a specific application, an IC designer has to assume that reliance on the device specification is a safe bet. An inevitable side effect originating from such an assumption is that it seriously reduces the dimension of the time window associated with a group of read data signals for data sampling. On the other hand, for a read strobe signal to sample the read data signals accurately, the data sampling window associated with the read data signals has to exceed a minimum duration. As a result, the only option for the IC designer to meet the two conflicting requirements is to sacrifice the application's performance by lowering its operating frequency such that even if the data skews are considered rigidly according to the memory device's specification, there is still sufficient time for reliable data sampling.

On the other hand, the actual data skews associated with a specific memory device in a particular application are often significantly smaller than the data in the device specification and it is not necessary to restrict the IC designer to the specification if there is an approach that takes into account the actual data skews automatically.

In view of the discussion above, it is highly desirable to have a memory interface device that places the edge of a read strobe signal exactly at the center of an actual data sampling window rather than shifting it by a predetermined value (e.g., 90°). It is further desirable to implement such a device in a programmable logic device to take advantage of its flexibility.

SUMMARY

The present invention is directed to a soft core logic circuit implemented in a PLD that estimates an appropriate phase delay and applies the phase shift to a read strobe signal in order for its rising and falling edges to align at the center of a data sampling window associated with a group of read data signals.

In one aspect of the present invention, the soft core logic circuit implements a read-side calibration algorithm that is used for identifying an appropriate phase shift value which can optimally center-align the read strobe signal with the read data signals. Different embodiments presented herein demonstrate that the algorithm is able to not only identify the optimum phase-shift value that should be applied to the read strobe signal, but also adjust the value to counter-balance the environmental impact.

In another aspect of the present invention, the soft core logic circuit introduces the signals generated by a phase-shift estimator, e.g., a delay-locked loop circuit, and a programmable phase delay chain into the PLD. These signals are not only used for the read-side signal calibration, but also accessible to a user of the PLD for other important purposes, e.g., modularized system debugging.

In yet another aspect of the present invention, the soft core logic circuit implemented in the PLD can manage multiple groups of data signals at the same time and a user of the PLD even has the option to modify the soft core logic circuit based on the user-specific requirements.

BRIEF DESCRIPTION OF THE DRAWINGS

The aforementioned features and advantages of the invention as well as additional features and advantages thereof will be more clearly understood hereinafter as a result of a detailed description of preferred embodiments of the invention when taken in conjunction with the drawings.

Like reference numerals refer to corresponding parts throughout the several views of the drawings.

DESCRIPTION OF EXEMPLARY EMBODIMENTS

The present invention is directed to a soft core logic circuit implemented in a PLD that estimates an appropriate phase delay and applies the phase shift to a read strobe signal in order for its rising and falling edges to focus at the center of a data sampling window associated with a group of read data signals.

Figure 1A:
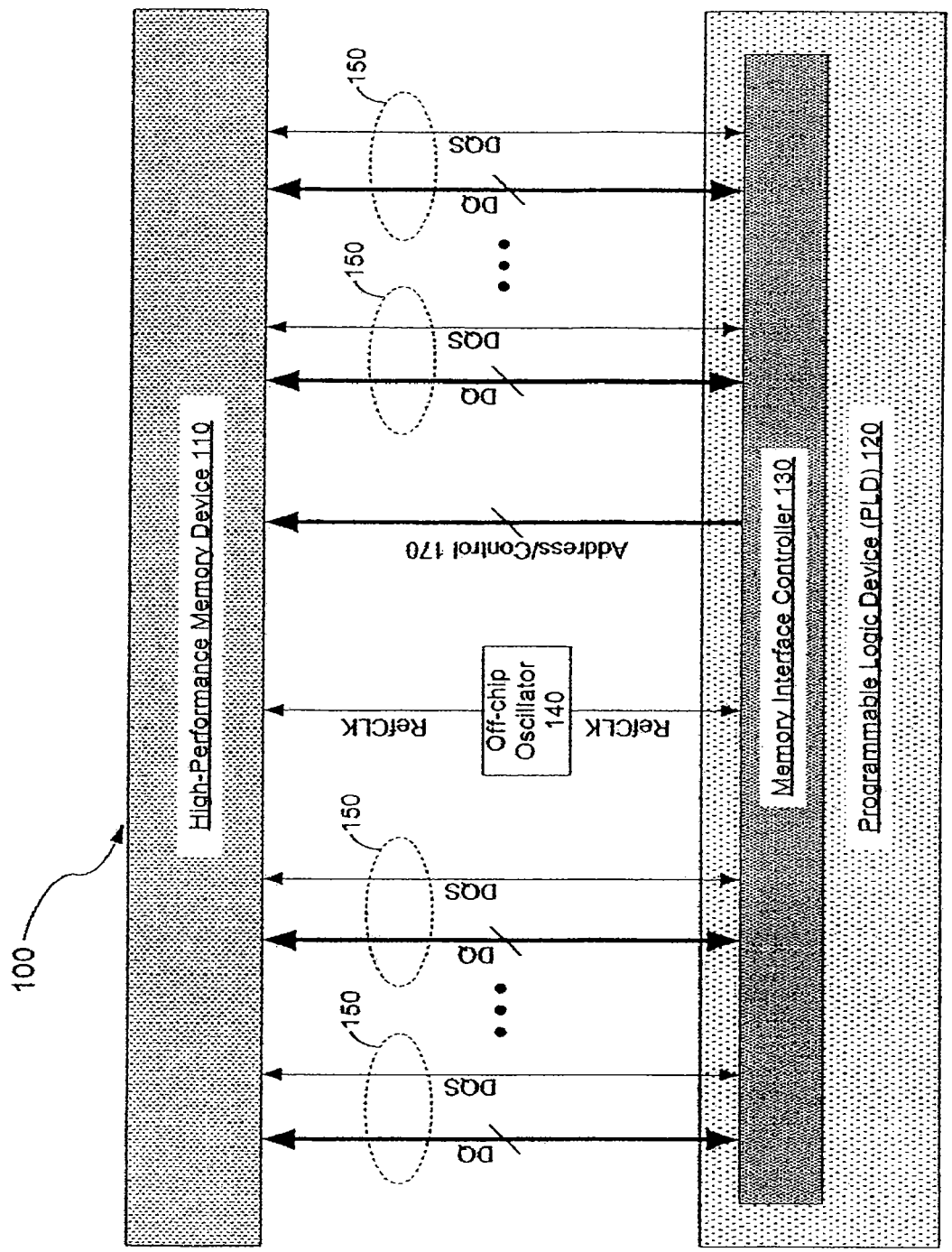
FIG. 1A illustrates a typical data transmission system that involves two commonly used devices, a high-performance memory device and a programmable logic device.
Figure 1B:
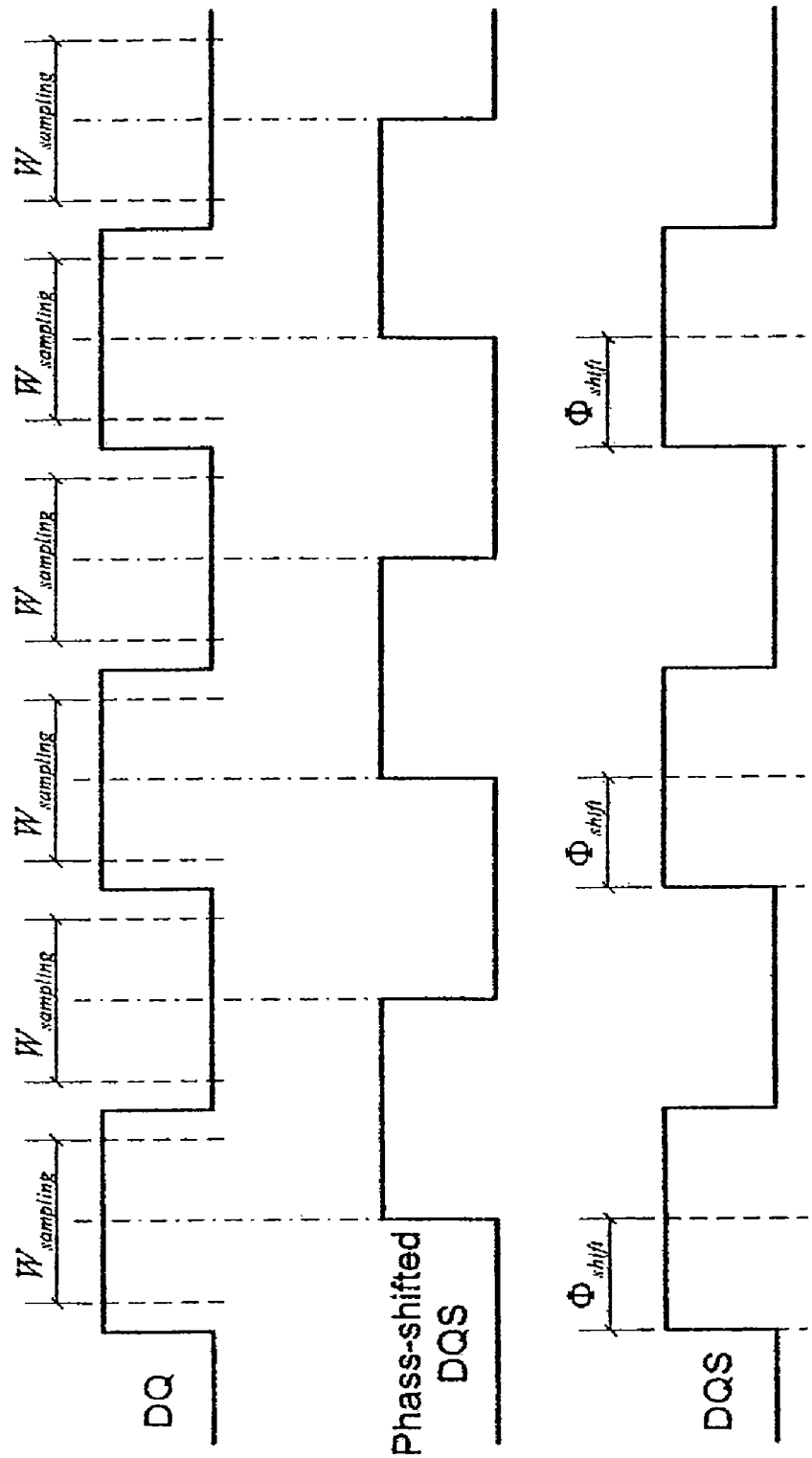
FIG. 1B schematically illustrates a typical DDR sampling scheme that can be applied to a memory interface circuit.
Figure 2:
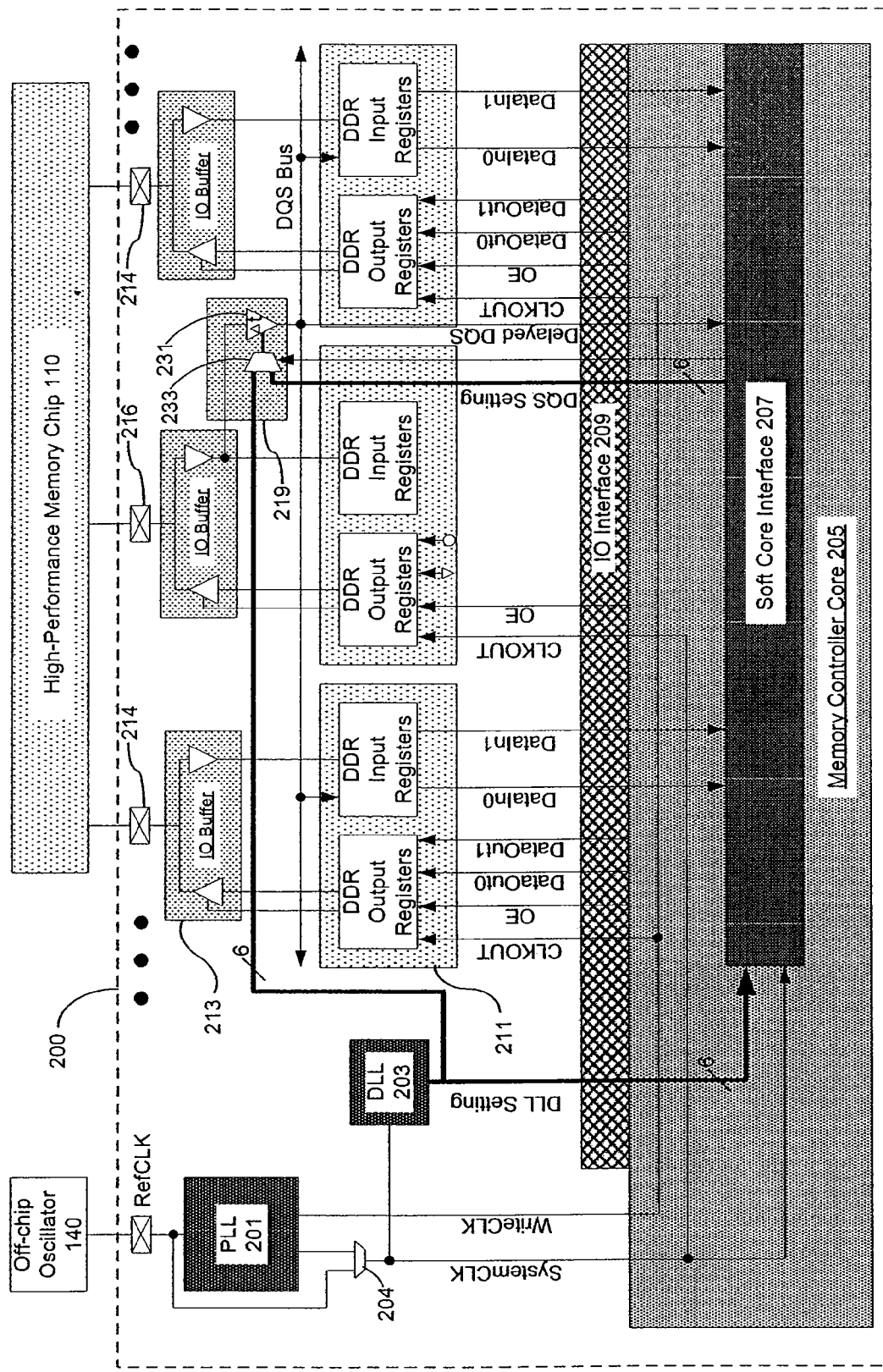
FIG. 2 is a schematic diagram of a read-side memory interface circuitry that incorporates a soft core logic circuit in accordance with the present invention.

FIG. 2 is a schematic diagram of a read-side memory interface circuitry 200 that incorporates a soft core interface 207 in accordance with the present invention. The memory circuitry 200 is implemented in a PLD that interfaces a high-performance memory chip 110. The memory interface circuitry 200 includes a plurality of DQ pins 214, DQS pins 216 and IO buffers 213, an IO interface 209 and a memory controller core 205. At each IO buffer 213, the circuitry 200 receives either a read data signal coming through a DQ pin 214 or a read strobe signal coming through a DQS pin 216. The read strobe signal is used for sampling each of the read data signals in a corresponding IO register block 211. However, prior to the data sampling, the read strobe signal is applied to a DQS delay chain 219 to be center-aligned with the read data signals to avoid generating errors during the data sampling.

To phase-shift a read strobe signal, the interface circuitry 200 inputs a reliable clock signal, e.g., the reference clock signal, RefCLK, from an off-chip oscillator 140. In one embodiment, this reference clock signal first routes through a phase-locked loop (PLL) circuit 201. The PLL circuit is usually used for generating a clock signal having the same frequency as the memory chip 110 if RefCLK's frequency is different from the memory chip's operating frequency. The PLL circuit can also filter out jitter associated with RefCLK and produce a cleaner clock signal. As shown below in connection with FIGS. 4A and 4B, less jitter also means more margins for accurate read data sampling. One output of PLL 201 provides a necessary write clock signal, WriteCLK, when the interface circuitry 200 sends data back to the memory chip 110 and the other provides the system clock signal, SystemCLK, for the rest of the interface circuitry 200.

In an alternative embodiment, the reference clock signal can be used directly as the system clock signal by the interface circuitry 200 without routing through PLL 201. Consequently, the interface circuitry 200 includes a multiplexer 204 that receives both the reference clock signal and the system clock signal at its input and outputs one of them to a delay-locked loop (DLL) circuit 203. The DLL 203 then generates a predetermined phase-shift specification, called a DLL setting. In one embodiment, the DLL setting is represented by 6 binary bits allowing the specification of any one of 64 settings, each corresponding to a specific phase shift value, e.g., 90° or 72°.

By contrast, the DLL setting generated by DLL 203 is submitted to a soft core interface 207 in one embodiment shown in FIG. 2. The soft core interface 207 implements a read-side calibration algorithm that is used for identifying an appropriate phase shift value which can optimally center-align the read strobe signal with the read data signals. The optimum phase shift value is expressed as a DQS setting, which may also be represented by 6 binary bits. The read-side calibration process (or the identification of the DQS setting) is typically an iterative process. The DLL setting is used as the initial estimate of the DQS setting. At the end of the read-side calibration process, the soft core interface 207 discovers the actual data sampling window of the read data signals and updates the DQS setting accordingly, which may be different from the DLL setting.

Figure 3:
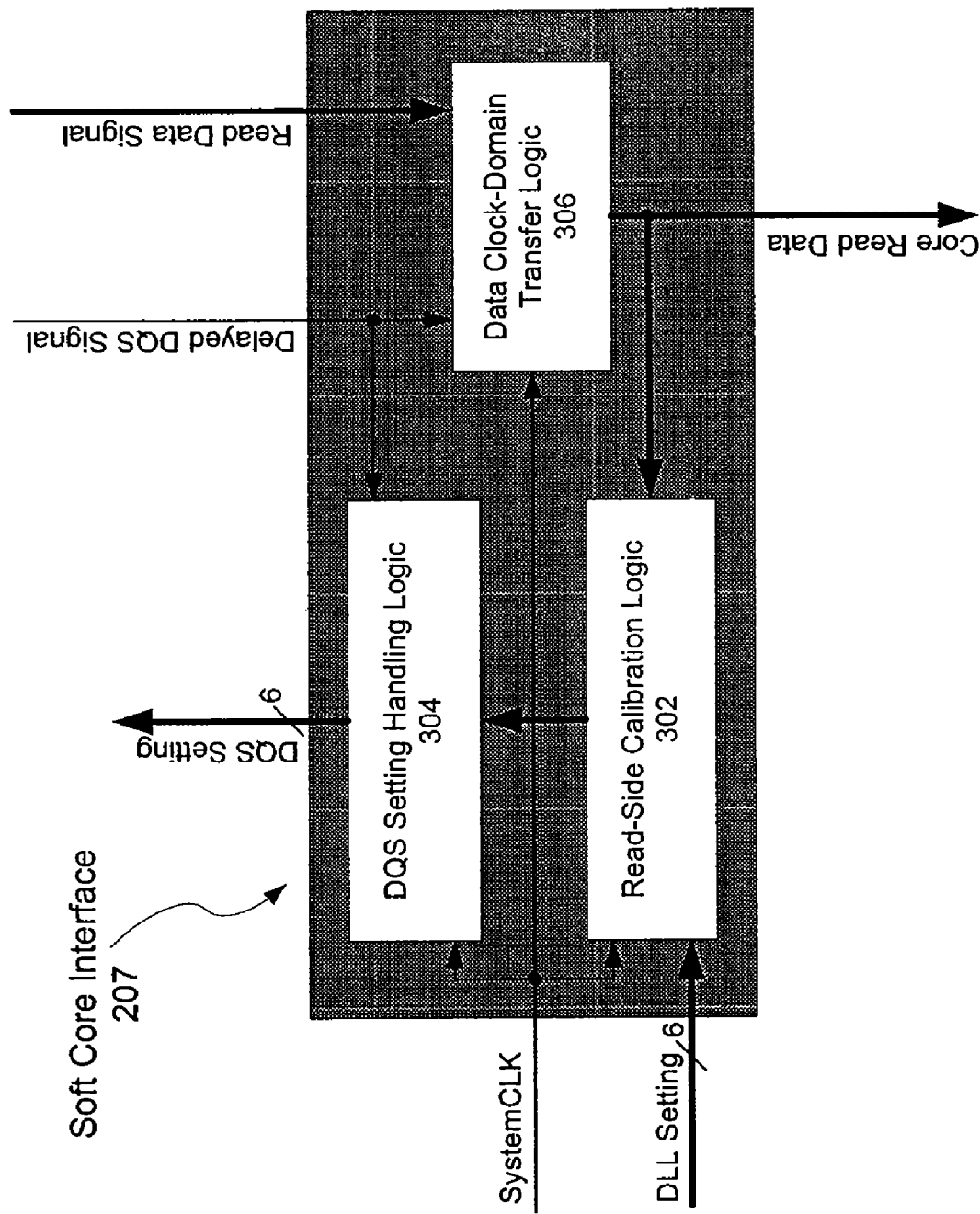
FIG. 3 is a schematic diagram illustrating the internal structure of a soft core interface in accordance with the present invention.

FIG. 3 is a schematic diagram illustrating the internal structure of the soft core interface 207 in accordance with the present invention. The soft core interface 207 includes a read-side calibration logic circuit 302, a DQS setting handling logic circuit 304 and a data clock-domain transfer logic circuit 306. In one embodiment, there is no dedicated hardware supporting any of the logic circuits in the soft core interface 207 and all logic circuits are implemented using programmable logic elements in the PLD itself. In another embodiment, at least some of the logic circuits, e.g., the read-side calibration logic circuit 302, may be implemented by dedicated hardware instead of using programmable logic elements in the PLD to achieve better performance. It will therefore be understood by one of ordinary skill in the art that the present invention covers any embodiment ranging from a purely PLD-based implementation to a purely dedicated hardware based implementation.

The read-side calibration logic circuit 302 receives the DLL setting generated by DLL 203 in FIG. 2. The read-side calibration logic circuit 302 executes a read-side calibration algorithm to generate a DQS setting that it passes to the DQS setting handling logic circuit 304. The DQS setting handling logic circuit 304 examines the delayed DQS signal coming from the DQS delay chain 219 to decide whether it is appropriate to transmit the DQS setting over to the DQS delay chain 219. This examination is made because both logic circuits 302 and 304 operate in accordance with the system clock signal, SystemCLK, while the DQS delay chain 219 operates in accordance with a different clock signal, the delayed DQS signal, which is out-of-phase with the system clock signal. The DQS delay chain 219 should only be updated by the DQS setting when it is not in the middle of transmitting the phase-shifted read strobe signal into the DQS bus to sample the read data signals.

In one embodiment, the DQS delay chain 219 is updated by the DQS setting when the system 100 incorporating the soft core interface 207 is powered on, since there is a period reserved for system self-examination during which there is no data transmission between the PLD 120 and the memory device 110. In another embodiment, the DQS delay chain 219 is updated whenever the memory interface circuitry 200 is not reading from the memory device 110, e.g., when the circuitry 200 writes data into the memory device 110 or when the circuitry 200 is idle. In another embodiment, the DQS delay chain 219 is updated on an as needed basis. For example, the soft core interface 207 may include a parity error detection logic circuit. Whenever an error is detected, this detection logic circuit sends a request to the memory interface circuitry 200, requiring that the memory access to the device 110 be halted when the DQS delay chain is updated by the DQS setting. Alternatively, the soft core interface 207 may update the DQS delay chain on the fly if the update is fast enough. In yet another embodiment, the DQS delay chain is updated periodically, in time or in number of cycles, no matter whether there is any sampling error or not.

Similar to the delayed DQS signal, the read data signals coming into the data clock-domain transfer logic circuit 306 are also asynchronous to the system clock signal because of the phase delay associated with the delayed DQS signal. One purpose of logic circuit 306 is to transfer the read data signal from one clock domain, the delayed DQS signal, to the other clock domain, the system clock signal, which is shared by other core logic circuits in the PLD. Sometimes, the phase shift between the system clock signal and the delayed DQS signal is fixed, e.g., if the system 100 operates in a stable environment, then the read data can be transferred from the first domain to the second domain accurately through a carefully timed sampling and there is no need for the data clock-domain logic circuit 306. However, if the phase shift between the two clock domains is not fixed due to various on-chip and/or off-chip skewing factors, e.g., the system 100 operates in an environment of changing temperatures, a device like the data clock-domain logic circuit 306 that receives both the system clock signal and the delayed DQS signal as inputs becomes critical for the clock domain transfer. In one embodiment, the data clock-domain logic circuit 306 is implemented using a first-in-first-out (FIFO) scheme, i.e., the first read data signal coming into the data clock-domain logic circuit 306 being transferred first and then sent out as core read data.

The availability of signals like the DLL setting and the delayed DQS signal in the PLD as shown in FIG. 3 has other advantages. For example, it is possible for the designer of the PLD to test the DLL and the DQS delay chain separately rather than testing different parts as a whole. Such a modularized testing strategy makes it easier to pinpoint the real source of certain problems existing in the PLD. Being able to access these intermediate signals from a user's perspective also gives the user of the PLD an advantage in debugging hardware related problems when the PLD is implemented in an electronic system.

The read-side calibration logic circuit 302 is used for implementing the read-side calibration algorithm. As mentioned above, a read strobe signal entering the memory interface circuitry 200 may not be exactly edge-aligned with a group of read data signals. Actually, due to the various on-chip and off-chip skewing factors, the read data signals themselves may not be edge-aligned with each other when they enter the memory interface circuitry 200. As a result, a fixed phase shift represented by the DLL setting may fail to position the read strobe signal's rising and falling edges at the center of a data sampling window or even completely miss the data sampling window associated with the read data signals.

Figure 4A:
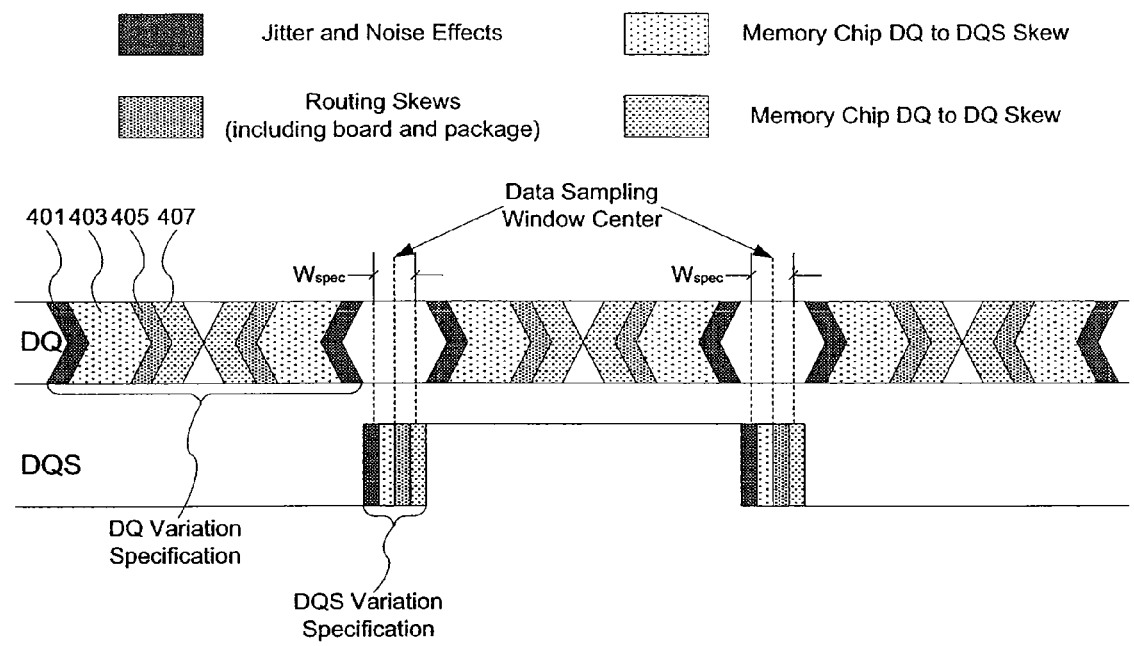
FIG. 4A schematically illustrates the impact of four typical data skewing factors on a data sampling window in accordance with a memory chip's specification.

FIG. 4A schematically illustrates the dilemma the designer may face using several data skewing factors when their impact on a read data signal (DQ) and a read strobe signal (DQS) is considered rigidly according to a memory chip's specification. Note that these skewing factors are chosen only for illustrative purposes, not intended to be inclusive. These four factors are:

the jitter and other noise effects 401, such as the varying transition periods between two adjacent signal cycles and the coupling effects from the power supply, etc.;

the memory chip DQ to DQS skew 403, e.g., a DQS signal may have a routing path slightly different from that of a DQ signal in the memory chip;

the routing skew 405 of different signals caused by the printed circuit board (PCB) routing and/or the package routing; and the memory chip DQ to DQ skew 407, e.g., two DQ signals may even have slightly different routing paths in the memory chip.

The accumulation of the data skews from these factors is represented by the DQ variation specification and DQS variation specification as shown in FIG. 4A. Because of the DQ variation specification, the width of the time window left for data sampling, $W_{spec}$, is so small that the boundary of the DQS variation specification may be even outside the time window. In other words, the rising or falling edges of the read strobe signal may fall outside the valid data sampling window, causing errors in the sampled read data. Even if the read strobe signal is phase-shifted such that its rising and falling edges are aligned with the center of the valid data sampling window, a slight environmental change, e.g., a variation in the temperature of the memory chip, may skew the read strobe signal's edges out of the data sampling window since the window is so narrow.

In summary, there are two serious issues with the conventional data sampling scheme: (1) it lacks necessary flexibility to deal with the data skewing factors by fixing the phase shift (e.g., 90°) of the read strobe signal; and (2) it significantly limits a designer by considering the skewing factors based on, e.g., a memory chip's specification which is often the worst scenario that could happen to a particular memory chip. The present invention proposes an alternative scheme, a read-side calibration (RSQ algorithm, that is both flexible and realistic when dealing with the various on-chip and off-chip skewing factors on a particular memory chip. The scheme is flexible because it does not apply a fixed phase shift to the read strobe signal. Instead, it manages to find the actual center of a data sampling window associated with a group of read data signals and shifts the read strobe signal accordingly. The scheme is realistic because it does not rigidly factor in every parameter in a specification provided, e.g., by a chip manufacturer. Instead, it only considers the actual impact of the various skewing factors on a particular memory chip. As a result, the width of the valid data sampling window associated with a group of read data signals increases substantially.

Figure 4B:
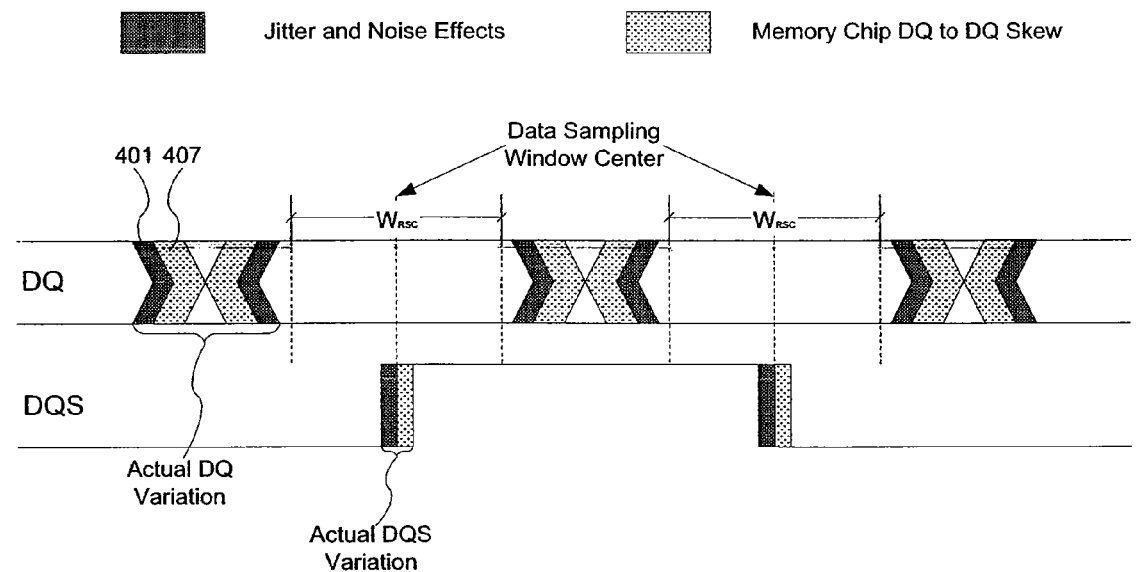
FIG. 4B schematically illustrates the impact of the four typical data skewing factors on the data sampling window in accordance with the read-side calibration algorithm of the present invention.

FIG. 4B schematically illustrates how the read-side calibration algorithm effectively reduces the adverse impacts of the various skewing factors on the valid data sampling window. First, the new scheme does not assume that the signals are edge-aligned when they enter the memory interface circuitry 200. Instead of applying a fixed 90° phase shift to the read strobe signal, the scheme dynamically detects the upper and lower bounds of the data sampling window of a group of read data signals. This detection automatically takes into account certain skewing factors, such as the memory chip DQ to DQS skew 403 and the routing skew 405, because the phase shift caused by these factors becomes part of the ultimate phase shift that will be applied to a read strobe signal. The two remaining skewing factors, the jitter and other noise effects 401 and the memory chip DQ to DQ skew 407, are considered according to their actual impact on the read data signals, not according to the specification which often significantly exaggerates the impact as demonstrated in FIG. 4A. As a result, the width of a valid data sampling window according to the new scheme, $W_{RSC}$, increases substantially, while the actual DQ and DQS variations drop significantly and there is little chance for the read strobe signal to miss the valid data sampling window.

It will be understood by one of ordinary skill in the art that the four factors shown in FIGS. 4A and 4B are primarily for illustrative purposes, that the impact of a skewing factor on the DQ or DQS signal may or may not be symmetric. Further, the representation of the impact of the skewing factors in FIGS. 4A and 4B may not be in proportion to their actual magnitude, which may vary dramatically depending on the type of a memory chip and the system in which it is used.

The read-side calibration logic circuit 302 takes advantage of the actual data sampling window that a particular memory device can afford and identifies an optimum phase-shift value represented by the DQS setting.

In a first embodiment, the read-side calibration logic circuit 302 applies a set of DQS settings to a DQS delay chain one by one, each DQS setting corresponding to a predetermined phase-shift value. The memory interface circuitry 200 samples a group of read data signals using a read strobe signal that is phase-shifted according to one particular setting to capture a calibration data pattern. Next, the memory interface circuitry 200 compares the calibration data pattern with a reference data pattern stored in the circuitry. As a result, the lower and upper bounds of the valid data sampling window are identified among the DQS settings such that any phase-shift value smaller than the lower bound and any one larger than the upper bound will cause at least one mismatch between the calibration data pattern and the reference data pattern. Based on the lower and upper bound phase-shift values, the memory interface circuitry defines an optimum phase-shift value as the average of the two boundary values and applies the optimum phase-shift value to the read strobe signal. This embodiment is referred to as the "full sweep" implementation of the read-side calibration algorithm.

In a second embodiment, read-side calibration logic circuit 302 uses the DLL setting input as the first estimate of the DQS setting to initiate a "smart search" for the optimum phase-shift value. For example, the read-side logic circuit 307 first slowly increases the phase-shift value associated with the DLL setting and conducts a series of data sampling experiments similar to what is described above in the first embodiment until the upper bound of the valid data sampling window is captured. Next, the read-side logic circuit 307 slowly decreases the phase-shift value associated with the DLL setting and identifies the lower bound of the data sampling window accordingly.

In a third embodiment, the read-side calibration logic circuit 302 assumes that the optimum phase-shift value is not fixed, but should adjust itself to accommodate the various environmental effects. Instead of locking a DQS delay chain to the optimum phase-shift value determined according to the previous two embodiments, the read-side calibration logic circuit 302 calculates a phase-shift difference between the optimum phase-shift value and the phase-shift value associated with the DLL setting. As a result, the optimum phase-shift value is conveniently expressed as the sum of the phase-shift difference and the phase-shift value associated with the DLL setting. The read-side calibration logic circuit 302, periodically or not, inputs the DLL setting and updates the DQS setting accordingly.

A significant advantage of the soft core interface 207 is that it is not a hardware implementation dedicated to any particular group of signals. Instead, the soft core interface 207 is capable of identifying a plurality of optimum phase-shift values for different groups and managing them simultaneously. Further, a user of the PLD hosting the soft core interface can customize the read-size calibration algorithm to his or her unique requirements if necessary.

The foregoing description, for purpose of explanation, has been made with reference to specific embodiments. However, the illustrative embodiments described above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. A method of calibrating an input circuit comprising:
   receiving a data strobe signal;
   delaying the data strobe signal by each of a plurality of delays;
   receiving a calibration data signal using the delayed data strobe signal;
   determining a minimum delay where the calibration data signal is correctly received;
   determining a maximum delay where the calibration data signal is correctly received; and
   determining an average delay by averaging the minimum delay and the maximum delay.

2. The method of claim 1 further comprising:
   delaying the data strobe signal by the average delay; and
   receiving a first data signal using the delayed data strobe signal.

3. The method of claim 1 wherein receiving the calibration data signal comprises receiving the calibration data signal with a double-data-rate register clocked by the delayed data strobe signal.

4. The method of claim 1 wherein the minimum delay where the calibration data signal is correctly received is determined by incrementing the delay until the calibration data signal is correctly received, and the maximum delay where the calibration data signal is received is determined by continuing to increment the delay until the calibration data signal is not correctly received.

5. The method of claim 1 wherein the maximum delay where the calibration data signal is correctly received is determined by incrementing the delay until the calibration data signal is not correctly received, and the minimum delay where the calibration data signal is received is determined by decrementing the delay until the calibration data signal is not correctly received.

6. The method of claim 1 further comprising:
   generating a first setting;
   determining a first difference value between the average delay and the first setting; and
   storing the first difference value.

7. The method of claim 6 further comprising:
   updating the first setting;
   adding the updated first setting to the first difference value to generate an updated delay;
   delaying the data strobe signal by the updated delay; and
   receiving a second data signal using the delayed data strobe signal.

8. The method of claim 7 wherein the first setting is generated using a delay-locked loop.

9. An integrated circuit comprising:
   an input circuit to receive a data strobe signal;
   a variable delay circuit to delay the data strobe signal;
   a double-data-rate register having a data input to receive data signals including a calibration data signal and a clock input to receive the delayed data strobe signal; and
   a logic circuit to change the delay provided by the variable delay circuit; to receive an output of the double-data-rate register and to determine a minimum delay whether the calibration data signal is correctly received and a maximum delay where the calibration data signal is correctly received; and to determine an average delay by averaging the minimum and maximum delays.

10. The integrated circuit of claim 9 wherein the logic circuit is implemented using programmable logic.

11. The integrated circuit of claim 9 wherein the logic circuit is configured by configuration data.

12. The integrated circuit of claim 9 wherein the logic circuit determines the minimum delay where the calibration data signal is correctly received by incrementing the delay until the calibration data signal is correctly received, and the logic circuit determines the maximum delay where the calibration data signal is received by continuing to increment the delay until the calibration data signal is not correctly received.

13. The integrated circuit of claim 9 wherein the logic circuit determines the maximum delay where the calibration data signal is correctly received by incrementing the delay until the calibration data signal is not correctly received, and the logic circuit determines the minimum delay where the calibration data signal is received by decrementing the delay until the calibration data signal is not correctly received.

14. The integrated circuit of claim 9 wherein the logic circuit further:
   generates a first setting;
   determines a first difference value between the average delay and the first setting; and
   stores the first difference value.

15. The integrated circuit of claim 14 wherein the logic circuit further:
   updates the first setting; and
   adds the updated first setting to the first difference value to generate an updated delay.

16. The integrated circuit of claim 15 wherein the first setting is generated using a delay-locked loop.

17. An integrated circuit comprising:
   a double-data-rate register having a data input and a clock input;
   a first logic circuit having an input coupled to an output of the double-data-rate register;
   an input buffer coupled to receive a data strobe signal;
   a variable delay line having an input coupled to an output of the input buffer, the variable delay line providing a variable delay to the data strobe signal; and
   a second logic circuit coupled to the variable delay line to vary the delay provided by the variable delay line and to determine a first delay where a first event occurs and a second delay where a second event occurs, and then to set the delay of the variable delay line to a third delay based on the first delay and the second delay.

18. The integrated circuit of claim 17 wherein the first logic circuit comprises a first-in-first-out memory.

19. The integrated circuit of claim 17 wherein the third delay is found by averaging the first delay and the second delay.

20. The integrated circuit of claim 17 wherein when the second logic circuit determines the first delay and the second delay, the second logic circuit increments the delay provided by the variable delay line in a plurality of steps.

* * * * *